(12) United States Patent
Cao et al.

(10) Patent No.: US 12,484,418 B2
(45) Date of Patent: Nov. 25, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Jinchuan Li, Guangdong (CN); Zhijun Wan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,042

(22) PCT Filed: Apr. 15, 2022

(86) PCT No.: PCT/CN2022/087061
§ 371 (c)(1),
(2) Date: Apr. 19, 2022

(87) PCT Pub. No.: WO2023/184596
PCT Pub. Date: Oct. 5, 2023

(65) Prior Publication Data
US 2024/0188384 A1 Jun. 6, 2024

(30) Foreign Application Priority Data
Apr. 1, 2022 (CN) .......................... 202210349154.6

(51) Int. Cl.
*H10K 59/80* (2023.01)
*H10K 71/00* (2023.01)

(52) U.S. Cl.
CPC ......... *H10K 59/873* (2023.02); *H10K 71/621* (2023.02)

(58) Field of Classification Search
CPC ...... H10K 59/873; H10K 59/00; H10K 50/80; H10K 50/844; H10K 71/621
See application file for complete search history.

(56) References Cited

U.S. PATENT DOCUMENTS

2020/0168683 A1* 5/2020 Son .................. H10K 77/10
2021/0020078 A1* 1/2021 Park .................. H10K 59/8731
(Continued)

FOREIGN PATENT DOCUMENTS

CN 107180923 A 9/2017
CN 110071153 A 7/2019
(Continued)

OTHER PUBLICATIONS

International Search Report in International application No. PCT/CN2022/087061, mailed on Dec. 20, 2022.
(Continued)

*Primary Examiner* — Vongsavanh Sengdara
(74) *Attorney, Agent, or Firm* — PV IP PC; Christopher S. Ruprecht; Wei Te Chung

(57) ABSTRACT

The present application provides a display panel and a manufacturing method thereof. The display panel includes a substrate, an inorganic layer, a photoresist layer, a packaging layer, and a groove; the inorganic layer is disposed on the substrate; the photoresist layer is disposed on a side of the inorganic layer away from the substrate; the packaging layer is disposed on a side of the photoresist layer away from the substrate; the groove includes a first groove part penetrating the photoresist layer and a second groove part penetrating the inorganic layer, and the packaging layer is disconnected at the groove.

12 Claims, 4 Drawing Sheets

(56) References Cited

U.S. PATENT DOCUMENTS

| | | | |
|---|---|---|---|
| 2021/0135155 A1 | 5/2021 | Xu et al. | |
| 2024/0188351 A1* | 6/2024 | Wang | H10K 59/122 |
| 2024/0188961 A1* | 6/2024 | Solaun | A61B 17/12113 |

FOREIGN PATENT DOCUMENTS

| | | | |
|---|---|---|---|
| CN | 110352627 A | 10/2019 | |
| CN | 110473983 A | 11/2019 | |
| CN | 112018045 A | 12/2020 | |
| CN | 112447924 A | 3/2021 | |
| CN | 113130618 A | 7/2021 | |
| CN | 114127946 A | 3/2022 | |
| JP | 2018025785 A | 2/2018 | |

OTHER PUBLICATIONS

Written Opinion of the International Search Authority in International application No. PCT/CN2022/087061, mailed on Dec. 16, 2022.

Chinese Office Action issued in corresponding Chinese Patent Application No. 202210349154.6 dated Jan. 14, 2025, pp. 1-7.

\* cited by examiner

DISPLAY PANEL AND MANUFACTURING METHOD THEREOF

BACKGROUND OF INVENTION

Field of Invention

The present application relates to a field of display technology, and particularly to a display panel and a manufacturing method thereof.

Description of Prior Art

Organic light emitting diode devices have become a next generation of display products with great competitiveness and development prospects because of a series of advantages such as their all solid-state structures, high brightness, full viewing angles, fast response speeds, wide working temperature ranges, and being able to achieve flexible display. Display panels are provided with the organic light emitting diode devices. Organic light emitting materials and cathode materials of the organic light emitting diode devices are particularly sensitive to water and oxygen, so being too wet or having overly high oxygen content will affect service life of the organic light emitting diode devices. Therefore, when the organic light emitting diode devices are used in the display panels, it is necessary to set a packaging layer to prevent water and oxygen from penetrating into the organic light emitting diode devices and avoid affecting the service life of the organic light emitting diode devices.

However, when cutting the display panels, the packaging layer is easy to generate cracks, and the cracks generated in the packaging layer easily spread to a display area of the display panels. In the prior art, addition of a crack prevention area or design of a longer effective packaging area are usually adopted to prevent the cracks from extending to the display area. However, a packaging effect of a method mentioned above is limited, and the longer effective packaging area increases a size of a frame area of the display panels, which affects a narrow frame design of the display panels.

SUMMARY OF INVENTION

The present application provides a display panel and a manufacturing method thereof, which can solve a packaging layer failure caused by cutting and achieve a narrow frame design.

On one hand, an embodiment of the present application provides one display panel, which includes a substrate, an inorganic layer, a photoresist layer, a packaging layer, and at least two grooves; the inorganic layer is disposed on the substrate; the photoresist layer is disposed on a side of the inorganic layer away from the substrate; the packaging layer is disposed on a side of the photoresist layer away from the substrate; each of the at least two grooves including a first groove part penetrating the photoresist layer and a second groove part penetrating the inorganic layer, wherein an orthographic projection of the second groove part on the substrate overlaps an orthographic projection of the first groove part on the substrate, and the packaging layer is disconnected at each of the at least two grooves; a groove diameter of the second groove part away from the substrate is at least 200 nm greater than a groove diameter of the first groove part close to the second groove part.

Alternatively, in some embodiments of the present application, a thickness of the inorganic layer is greater than 100 nm.

Alternatively, in some embodiments of the present application, the display panel further includes a metal layer, the metal layer is disposed on a side of the inorganic layer close to the substrate, the metal layer is provided with a third groove part corresponding to the second groove part, and an orthographic projection of the third groove part on the substrate overlaps the orthographic projection of the second groove part on the substrate.

Alternatively, in some embodiments of the present application, a cross-section shape of the first groove part along a first direction, a cross-section shape of the second groove part along the first direction, and a cross-section shape of the third groove part along the first direction are all inverted trapezoids.

Alternatively, in some embodiments of the present application, one of the at least two grooves is located on a cutting line.

Alternatively, in some embodiments of the present application, the display panel includes a display area and a frame area; the frame area includes a wiring area, an effective packaging area, and a cutting area; the effective packaging area is located on a side of the wiring area away from the display area, the cutting area is located on a side of the effective packaging area away from the wiring area, and the at least two grooves are located in the cutting area.

An embodiment of the present application provides another one display panel, which includes a substrate, an inorganic layer, a photoresist layer, a packaging layer, and at least one groove; the inorganic layer is disposed on the substrate; the photoresist layer is disposed on a side of the inorganic layer away from the substrate; the packaging layer is disposed on a side of the photoresist layer away from the substrate; the at least one groove including a first groove part penetrating the photoresist layer and a second groove part penetrating the inorganic layer, wherein an orthographic projection of the second groove part on the substrate overlaps an orthographic projection of the first groove part on the substrate, and the packaging layer is disconnected at the at least one groove.

Alternatively, in some embodiments of the present application, a groove diameter of the second groove part away from the substrate is at least 200 nm greater than a groove diameter of the first groove part close to the second groove part.

Alternatively, in some embodiments of the present application, a thickness of the inorganic layer is greater than 100 nm.

Alternatively, in some embodiments of the present application, the display panel further includes a metal layer, the metal layer is disposed on a side of the inorganic layer close to the substrate, the metal layer is provided with a third groove part corresponding to the second groove part, and an orthographic projection of the third groove part on the substrate overlaps the orthographic projection of the second groove part on the substrate.

Alternatively, in some embodiments of the present application, a cross-section shape of the first groove part along a first direction, a cross-section shape of the second groove part along the first direction, and a cross-section shape of the third groove part along the first direction are all inverted trapezoids.

Alternatively, in some embodiments of the present application, the display panel includes at least two grooves.

Alternatively, in some embodiments of the present application, one of the at least two grooves is located on a cutting line.

Alternatively, in some embodiments of the present application, the display panel includes a display area and a frame area; the frame area includes a wiring area, an effective packaging area, and a cutting area; the effective packaging area is located on a side of the wiring area away from the display area, the cutting area is located on a side of the effective packaging area away from the wiring area, and the at least one groove is located in the cutting area.

On another hand, the present application provides a manufacturing method of a display panel, which includes following steps: forming an inorganic layer on a substrate; forming a photoresist layer on the inorganic layer, and forming a first groove part of at least one groove on the photoresist layer; forming a second groove part corresponding to the first groove part on the inorganic layer, and an orthographic projection of the second groove part on the substrate overlapping an orthographic projection of the first groove part on the substrate; forming a packaging layer on the photoresist layer.

Alternatively, in some embodiments of the present application, the step of forming the second groove part corresponding to the first groove part on the inorganic layer, and the orthographic projection of the second groove part on the substrate overlapping the orthographic projection of the first groove part on the substrate, specifically includes: forming a metal layer on a side of the inorganic layer close to the substrate, and forming a third groove part corresponding to the second groove part on the metal layer, and an orthographic projection of the third groove part on the substrate being overlapping the orthographic projection of the second groove part on the substrate.

Alternatively, in some embodiments of the present application, a cross-section shape of the first groove part along a first direction, a cross-section shape of the second groove part along the first direction, and a cross-section shape of the third groove part along the first direction are all inverted trapezoids.

Alternatively, in some embodiments of the present application, the display panel includes at least two grooves.

Alternatively, in some embodiments of the present application, one of the at least two grooves is located on a cutting line.

Alternatively, in some embodiments of the present application, the display panel includes a display area and a frame area; the frame area includes a wiring area, an effective packaging area, and a cutting area; the effective packaging area is located on a side of the wiring area away from the display area, the cutting area is located on a side of the effective packaging area away from the wiring area, and the at least one groove is located in the cutting area.

The present application provides the display panel and the manufacturing method thereof. The display panel includes the substrate, the inorganic layer, the photoresist layer, the packaging layer, and the at least one groove; the inorganic layer is disposed on the substrate; the photoresist layer is disposed on the side of the inorganic layer away from the substrate; the packaging layer is disposed on the side of the photoresist layer away from the substrate; the at least one groove includes the first groove part penetrating the photoresist layer and the second groove part penetrating the inorganic layer, wherein the orthographic projection of the second groove part on the substrate overlaps the orthographic projection of the first groove part on the substrate, and the packaging layer is disconnected at the at least one groove. By forming the first groove part and the second groove part into an "eaves like" inscribed structure, when cutting the display panel, cutting cracks generated by the packaging layer is difficult to extend out of an area where the groove located, which avoids the packaging layer failure caused by the cutting cracks of the packaging layer extending to the display area of the display panel, and achieves the narrow frame design.

BRIEF DESCRIPTION OF DRAWINGS

In order to clearly explain technical solutions in embodiments of the present application, the following will briefly introduce drawings needed to be used in descriptions of the embodiments. It is obvious that the drawings in the following descriptions are only some embodiments of the present application. For those skilled in the art, other drawings can be obtained according to these drawings without paying creative labor.

Wherein,
100/200/300/400/500: a display panel;
10: a substrate;
101: a wiring area;
102: an effective packaging area;
103: a cutting area;
20: an inorganic layer;
30: a photoresist layer;
31: a first photoresist layer;
32: a second photoresist layer;
40: a packaging layer;
50: a groove;
51: a first groove part;
52: a second groove part;
53: a third groove part;
60: a metal layer;
AA: a display area;
NA: a frame area;
C: a cutting line.

DETAILED DESCRIPTION OF EMBODIMENTS

Technical schemes in embodiments of the present application will be clearly and completely described below in combination with accompanying drawings in the embodiments of the present application. Obviously, the described embodiments are only part of the embodiments of the present application, but not all of the embodiments. Based on the embodiments in the present application, all other embodiments obtained by those skilled in the art without creative work belong to a scope of a protection of the present application.

Embodiment of the present application provide display panels and a manufacturing method thereof, which can solve a packaging layer failure caused by cutting and achieve a narrow frame design. The following are described in detail. It should be noted that an order of description of the following embodiments is not a limitation of a preferred order of the embodiments. In addition, in the description of the present application, a term "including" refers to "including but not limited to". Terms "first", "second", "third" and so on are used only as signs, which are used to distinguish different objects, and not to describe a specific order.

Figure 1:
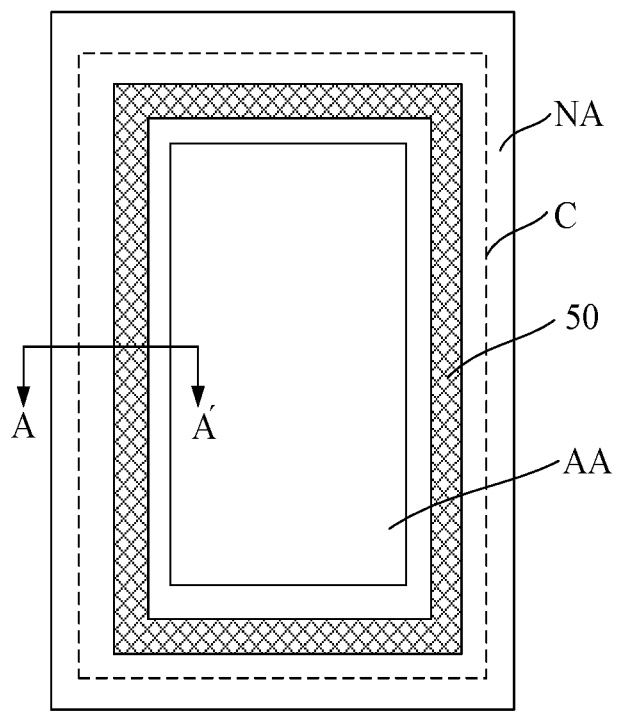
FIG. 1 is a top view of a display panel provided by an embodiment of the present application.
Figure 2:
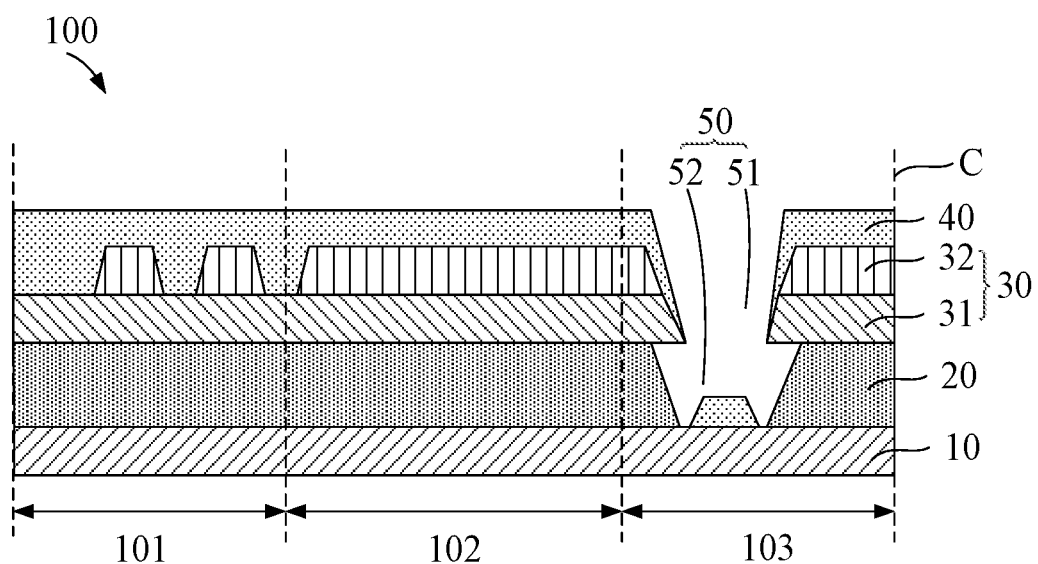
FIG. 2 is a cross-sectional view along a direction A-A' in FIG. 1 provided by a first embodiment of the present application.

Referring to FIG. 1 and FIG. 2, FIG. 1 is a top view of a display panel provided by an embodiment of the present application; FIG. 2 is a cross-sectional view along a direction A-A' in FIG. 1 provided by a first embodiment of the present application. As shown in FIG. 1 and FIG. 2, the first embodiment of the present application provides a display panel 100, which includes a substrate 10, an inorganic layer 20, a photoresist layer 30, a packaging layer 40, and a groove 50; the inorganic layer 20 is disposed on the substrate 10; the photoresist layer 30 is disposed on a side of the inorganic layer 20 away from the substrate 10; the packaging layer 40 is disposed on a side of the photoresist layer 30 away from the substrate 10; the groove 50 includes a first groove part 51 penetrating the photoresist layer 30 and a second groove part 52 penetrating the inorganic layer 20, wherein an orthographic projection of the second groove part 52 on the substrate 10 overlaps an orthographic projection of the first groove part 51 on the substrate 10, and the packaging layer 40 is disconnected at the groove 50.

In the embodiment of the present application, the display panel 100 includes a display area AA and a frame area NA. Specifically, the frame area NA includes a wiring area 101, an effective packaging area 102, and a cutting area 103. The effective packaging area 102 is located on a side of the wiring area 101 away from the display area AA, the cutting area 103 is located on a side of the effective packaging area 102 away from the wiring area 101, and the groove 50 is located in the cutting area 103. Wherein the cutting area 103 is an area reserved for cutting on the display panel 100, which includes a standard line for an alignment cutting, that is, a cutting line C, in order to ensure cutting accuracy and a heat affected area. Wherein a width of the cutting area 103 can be adjusted according to actual demands, and is not limited by the present application here.

In the embodiment of the present application, the packaging layer 40 in the groove 50 is disconnected from the packaging layer 40 outside the groove 50. When cutting the display panel 100 along the cutting line C, cutting cracks are generated from a cutting position of the packaging layer 40 in the groove 50, and the cutting cracks will stop when extending to a wall of the groove 50, that is, the cutting cracks will not exist in the packaging layer 40 outside the groove 50, which avoids a failure problem of the packaging layer 40 caused by the cutting cracks of the packaging layer 40 extending to the display area AA of the display panel 100, and meanwhile, a narrow frame design can be achieved to further ensure quality of the display panel 100.

In the embodiment of the present application, the substrate 10 can be a flexible substrate, such as a polyimide substrate. The photoresist layer 30 includes a first photoresist layer 31 and a second photoresist layer 32 disposed in a stack. The first groove part 51 includes a first sub groove part (not shown in drawings) disposed on the first photoresist layer 31 and a second sub groove part (not shown in the drawings) disposed on the second photoresist layer 32. An orthographic projection of the second sub groove part on the substrate 10 overlaps an orthographic projection of the first sub groove part on the substrate 10. Wherein the first photoresist layer 31 is a planarization layer; the second photoresist layer 32 is a pixel defining layer, and such a structural design is same as a setting of film layers in the prior art.

It should be noted that an edge of the second photoresist layer 32 cannot extend to the cutting area 103. Specifically, the second photoresist layer 32 can only extend to the effective packaging area 102, so as to reduce numbers of overlapping film layers in the cutting area 103 and improve stability of the display panel 100.

In the embodiment of the present application, a first direction is an A-A' direction shown in FIG. 1, wherein a cross-section shape of the first groove part 51 along the A-A' direction and a cross-section shape of the second groove part 52 along the A-A' direction are both inverted trapezoids, that is, a diameter of the first groove part 51 close to the substrate 10 is less than a diameter of the second groove part 52 away from the substrate 10. Such a structural design is more conducive to a disconnection of the packaging layer 40 at the groove 50.

In the embodiment of the present application, a groove diameter of the second groove part 52 away from the substrate 10 is at least 200 nm greater than a groove diameter of the first groove part 51 close to the second groove part 52. Further, a diameter of the first groove part 51 away from the second groove part 52 is at least 200 nm less than a diameter of the second groove part 52 close to the substrate 10. A structural design of the first groove part 51 and the second groove part 52 being wider at a top and narrower at a bottom is more unfavorable to a deposition of materials of the packaging layer 40 on a side wall of the second groove part 52, and is more conducive to blocking a connection between the packaging layer 40 located at a bottom of the second groove part 52 and the packaging layer 40 located on the first groove part 51, so that the packaging layer 40 is disconnected at the second groove part 52.

In the embodiment of the present application, a thickness of the inorganic layer 20 is greater than 100 nm. Wherein the inorganic layer 20 can include inorganic materials such as a silicon nitride, a silicon oxide, a laminate of the silicon nitride and the silicon oxide, or a laminate of an alumina and the silicon oxide. The silicon nitride has a strong ion barrier ability and a good water-oxygen isolation ability, which can effectively prevent impurities from diffusing into the display panel 100 in a thermal process, and moreover, the silicon oxide also has good interface performance.

In the embodiment of the present application, the packaging layer 40 can adopt an inorganic packaging layer, an organic packaging layer, or the inorganic packaging layer and the organic packaging layer alternately stacked. Wherein the inorganic packaging layer can include inorganic materials such as alumina, silicon oxide, silicon nitride, silicon oxynitride, silicon carbide, titanium oxide, zirconia, zinc oxide, and so on. The organic packaging layer can include organic materials such as epoxy resin, polyimide, polyethylene terephthalate, polycarbonate, polyethylene, polyacrylate, and so on.

In the display panel 100 provided by the embodiment of the present application, by forming the first groove part 51 and the second groove part 52 into an "eaves-like" inscribed structure, when cutting the display panel 100, it is difficult for the cutting cracks to extend out of an area where the groove 50 located, which avoids the failure problem of the packaging layer 40 caused by the cutting cracks of the packaging layer 40 extending to the display area AA of the display panel 100, and achieves the narrow frame design.

Figure 3:
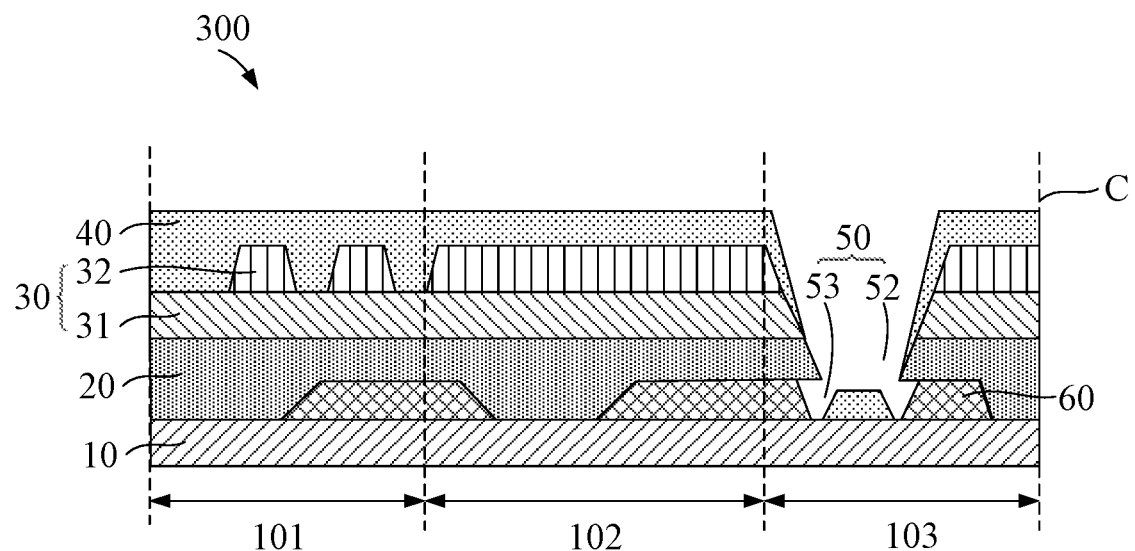
FIG. 3 is a cross-sectional view along the direction A-A' in FIG. 1 provided by a second embodiment of the present application.

As a specific embodiment of the present application, please refer to FIG. 3, FIG. 3 is a cross-sectional view along a direction A-A' in FIG. 1 provided by a second embodiment of the present application. As shown in FIG. 3, a difference between a display panel 300 and the display panel 100 is that the display panel 300 further includes a metal layer 60; the metal layer 60 is disposed on a side of an inorganic layer 20 close to a substrate 10, the metal layer 60 is provided with a third groove part 53 corresponding to a second groove part 52, and an orthographic projection of the third groove part 53 on the substrate 10 overlaps an orthographic projection of the second groove part 52 on the substrate 10.

In the embodiment of the present application, the display panel 300 includes a display area AA and a frame area NA. Specifically, the frame area NA includes a wiring area 101, an effective packaging area 102, and a cutting area 103. The effective packaging area 102 is located on a side of the wiring area 101 away from the display area AA, the cutting area 103 is located on a side of the effective packaging area 102 away from the wiring area 101, and a groove 50 is located in the cutting area 103. Wherein the cutting area 103 is an area reserved for cutting on the display panel 300, which includes a standard line for an alignment cutting, that is, a cutting line C, in order to ensure cutting accuracy and a heat affected area. Wherein a width of the cutting area 103 can be adjusted according to actual demands, and is not limited by the present application here.

In the embodiment of the present application, in order to simplify process fabrication and improve cutting accuracy, preferably, a photoresist layer 30 is only disposed in the wiring area 101 and the effective packaging area 102, and the groove 50 includes the third groove part 53 penetrating the metal layer 60 and the second groove part 52 penetrating the inorganic layer 20. The photoresist layer 30 can also be extended to the cutting area 103 as needed, which can be selected by those skilled in the art as needed and is not limited by the present application here.

In the embodiment of the present application, a first direction is an A-A' direction shown in FIG. 1, wherein a cross-section shape of the third groove part 53 along the A-A' direction and a cross-section shape of the second groove part 52 along the A-A' direction are both inverted trapezoids, that is, a diameter of the third groove part 53 close to the substrate 10 is less than a diameter of the second groove part 52 away from the substrate 10. Such a structural design is more conducive to a disconnection of the packaging layer 40 at the groove 50.

In the embodiment of the present application, a groove diameter of the third groove part 53 away from the substrate 10 is at least 200 nm greater than a groove diameter of the second groove part 52 close to the third groove part 53. Further, a diameter of the second groove part 52 away from the third groove part 53 is at least 200 nm less than a diameter of the third groove part 53 close to the substrate 10. A structural design of the third groove part 53 and the second groove part 52 being wider at a top and narrower at a bottom is more unfavorable to a deposition of materials of the packaging layer 40 on a side wall of the second groove part 52, and is more conducive to blocking a connection between the packaging layer 40 located at the bottom of the third groove part 53 and the packaging layer 40 located on the second groove part 52, so that the packaging layer 40 is disconnected at the third groove part 53.

In the embodiment of the present application, a thickness of the metal layer 60 is greater than 100 nm. The metal layer 60 can include at least one of a metal such as molybdenum, aluminum, copper, titanium, chromium, silver, etc., or mixtures thereof; the metal layer 60 can be a single film structure or a multi-film structure.

In the embodiment of the present application, the packaging layer 40 is disconnected at the groove 50. That is, the packaging layer 40 in the groove 50 is disconnected from the packaging layer 40 outside the groove 50. When cutting the display panel 300 along the cutting line C, cutting cracks are generated from a cutting position of the packaging layer 40 in the groove 50, and the cutting cracks will stop when extending to a wall of the groove 50, that is, the cutting cracks will not exist in the packaging layer 40 outside the groove 50, which avoids a failure problem of the packaging layer 40 caused by the cutting cracks of the packaging layer 40 extending to the display area AA of the display panel 300, and meanwhile, a narrow frame design can be achieved to further ensure quality of the display panel 300.

In the embodiment of the present application, the packaging layer 40 can adopt an inorganic packaging layer, an organic packaging layer, or the inorganic packaging layer and the organic packaging layer alternately stacked. Wherein the inorganic packaging layer can include inorganic materials such as alumina, silicon oxide, silicon nitride, silicon oxynitride, silicon carbide, titanium oxide, zirconia, zinc oxide, and so on. The organic packaging layer can include organic materials such as epoxy resin, polyimide, polyethylene terephthalate, polycarbonate, polyethylene, polyacrylate, and so on.

Figure 4:
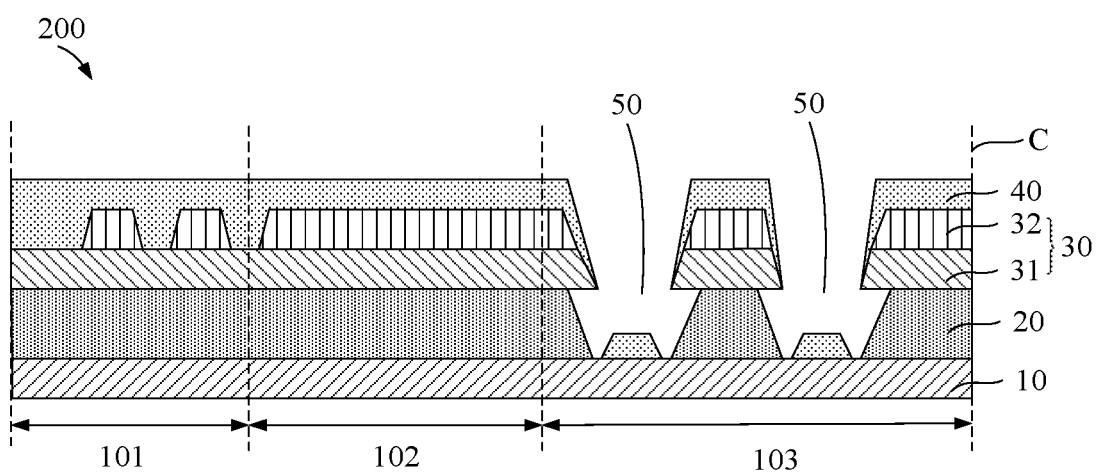
FIG. 4 is a cross-sectional view along the direction A-A' in FIG. 1 provided by a third embodiment of the present application.

As a specific embodiment of the present application, please refer to FIG. 4 and FIG. 2. FIG. 4 is a cross-sectional view along a direction A-A' in FIG. 1 provided by a third embodiment of the present application. As shown in FIG. 4 and FIG. 2, a difference between a display panel 200 and the display panel 100 is that the display panel 200 includes at least two grooves 50.

In the embodiment of the present application, the display panel 200 includes a display area AA and a frame area NA. Specifically, the frame area NA includes a wiring area 101, an effective packaging area 102, and a cutting area 103. The effective packaging area 102 is located on a side of the wiring area 101 away from the display area AA, the cutting area 103 is located on a side of the effective packaging area 102 away from the wiring area 101, and the at least two grooves 50 are located in the cutting area 103. Wherein the cutting area 103 is an area reserved for cutting on the display panel 200, which includes a standard line for an alignment cutting, that is, a cutting line C, in order to ensure cutting accuracy and a heat affected area. Wherein a width of the cutting area 103 can be adjusted according to actual demands, and is not limited by the present application here.

In the embodiment of the present application, a first direction is an A-A' direction shown in FIG. 1, wherein a cross-section shape of a first groove part 51 along the A-A' direction and a cross-section shape of a second groove part 52 along the A-A' direction are both inverted trapezoids, that is, a diameter of the first groove part 51 close to a substrate 10 is less than a diameter of the second groove part 52 away from the substrate 10. Such a structural design is more conducive to a disconnection of a packaging layer 40 in each of the at least two grooves 50.

In the embodiment of the present application, a groove diameter of the second groove part 52 away from the substrate 10 is at least 200 nm greater than a groove diameter of the first groove part 51 close to the second groove part 52. Further, a diameter of the first groove part 51 away from the second groove part 52 is at least 200 nm less than a diameter of the second groove part 52 close to the substrate 10. An structural design of the first groove part 51 and the second groove part 52 being wider at a top and narrower at a bottom is more unfavorable to a deposition of materials of the packaging layer 40 on a side wall of the second groove part 52, and is more conducive to blocking a connection between the packaging layer 40 located at a bottom of the second groove part 52 and the packaging layer 40 located on the first groove part 51, so that the packaging layer 40 is disconnected at the second groove part 52.

In the embodiment of the present application, the at least two grooves 50 can be both disposed at the cutting line C in the cutting area 103, or one of the at least two grooves 50 can be disposed at the cutting line C. A design of the at least two grooves 50 is to further consider influence of a cutting error. When one of the at least two grooves 50 loses a blocking effect on cutting cracks, other grooves 50 close to the display area AA of the display panel 200 can also block the cutting cracks, which further ensures quality of the display panel 200.

Figure 5:
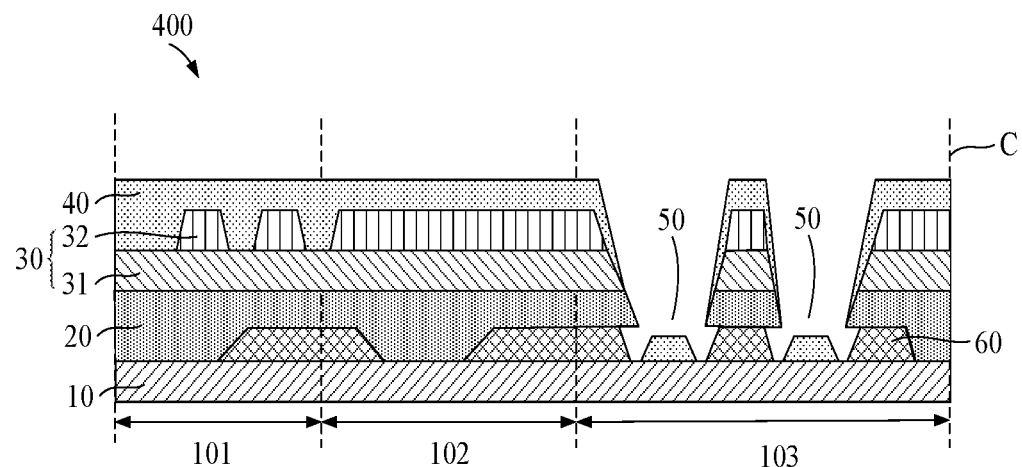
FIG. 5 is a cross-sectional view along the direction A-A' in FIG. 1 provided by a fourth embodiment of the present application.

As a specific embodiment of the present application, please refer to FIG. 5 and FIG. 3, FIG. 5 is a cross-sectional view along a direction A-A' in FIG. 1 provided by a fourth embodiment of the present application. As shown in FIG. 5 and FIG. 3, a difference between a display panel 400 and the display panel 300 is that the display panel 400 includes at least two grooves 50.

In the embodiment of the present application, the display panel 400 includes a display area AA and a frame area NA. Specifically, the frame area NA includes a wiring area 101, an effective packaging area 102, and a cutting area 103. The effective packaging area 102 is located on a side of the wiring area 101 away from the display area AA, the cutting area 103 is located on a side of the effective packaging area 102 away from the wiring area 101, and the at least two grooves 50 are located in the cutting area 103. Wherein the cutting area 103 is an area reserved for cutting on the display panel 400, which includes a standard line for an alignment cutting, that is, a cutting line C, in order to ensure cutting accuracy and a heat affected area. Wherein a width of the cutting area 103 can be adjusted according to actual demands, and is not limited by the present application here.

In the embodiment of the present application, in order to simplify process fabrication and improve cutting accuracy, preferably, a photoresist layer 30 is only disposed in the wiring area 101 and the effective packaging area 102, and each of the at least two grooves 50 includes a third groove part 53 penetrating a metal layer 60 and a second groove part 52 penetrating an inorganic layer 20. The photoresist layer 30 can also be extended to the cutting area 103 as needed, which can be selected by those skilled in the art as needed and is not limited by the present application here.

In the embodiment of the present application, a first direction is an A-A' direction shown in FIG. 1, wherein a cross-section shape of the third groove part 53 along the A-A' direction and a cross-section shape of the second groove part 52 along the A-A' direction are both inverted trapezoids, that is, a diameter of the third groove part 53 close to a substrate 10 is less than a diameter of the second groove part 52 away from the substrate 10. Such a structural design is more conducive to a disconnection of the packaging layer 40 at the each of the at least two grooves 50.

In the embodiment of the present application, a groove diameter of the third groove part 53 away from the substrate 10 is at least 200 nm greater than a groove diameter of the second groove part 52 close to the third groove part 53. Further, a diameter of the second groove part 52 away from the third groove part 53 is at least 200 nm less than a diameter of the third groove part 53 close to the substrate 10. A structural design of the third groove part 53 and the second groove part 52 being wider at a top and narrower at a bottom is more unfavorable to a deposition of materials of the packaging layer 40 on a side wall of the second groove part 52, and is more conducive to blocking a connection between the packaging layer 40 located at a bottom of the third groove part 53 and the packaging layer 40 located on the second groove part 52, so that the packaging layer 40 is disconnected at the third groove part 53.

In the embodiment of the present application, the at least two grooves 50 can be both disposed at the cutting line C in the cutting area 103, or one of the at least two grooves 50 can be disposed at the cutting line C. A design of the at least two grooves 50 is to further consider influence of a cutting error. When one of the at least two grooves 50 loses a blocking effect to cutting cracks, other grooves 50 close to the display area AA of the display panel 400 can also block the cutting cracks, which further ensures quality of the display panel 400.

Figure 6:
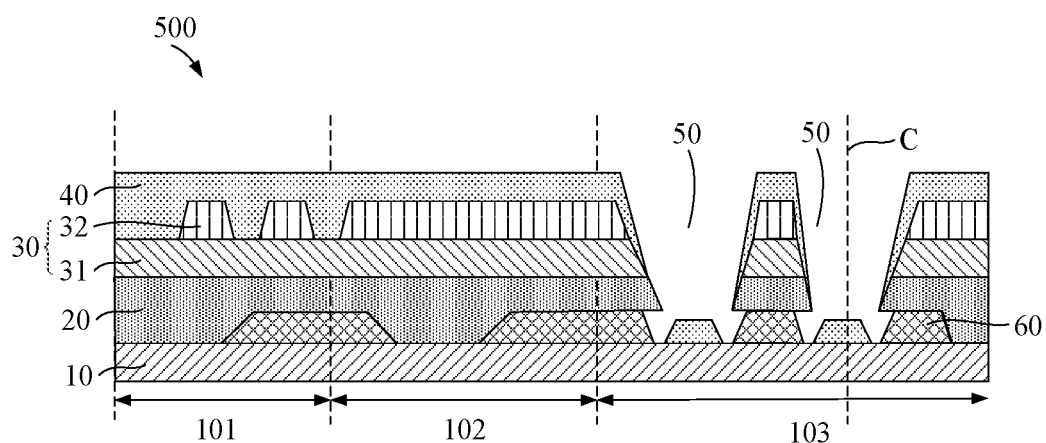
FIG. 6 is a cross-sectional view along the direction A-A' in FIG. 1 provided by a fifth embodiment of the present application.

As a specific embodiment of the present application, please refer to FIG. 6, FIG. 6 is a cross-sectional view along a direction A-A' in FIG. 1 provided by a fifth embodiment of the present application. As shown in FIG. 6, a display panel 500 includes at least two grooves 50, and one of the at least two grooves 50 is located on a cutting line C. Taking two grooves 50 as an example in FIG. 6, a number of grooves 50 can also be multiple.

In the embodiment of the present application, by setting the at least two grooves 50 in the display panel 500, it is more difficult for cutting cracks generated by the packaging layer 40 to extend to a display area AA of the display panel 500, so as to further improve a packaging effect of the display panel 500 and improve service life and competitiveness of the display panel 500.

Figure 7:
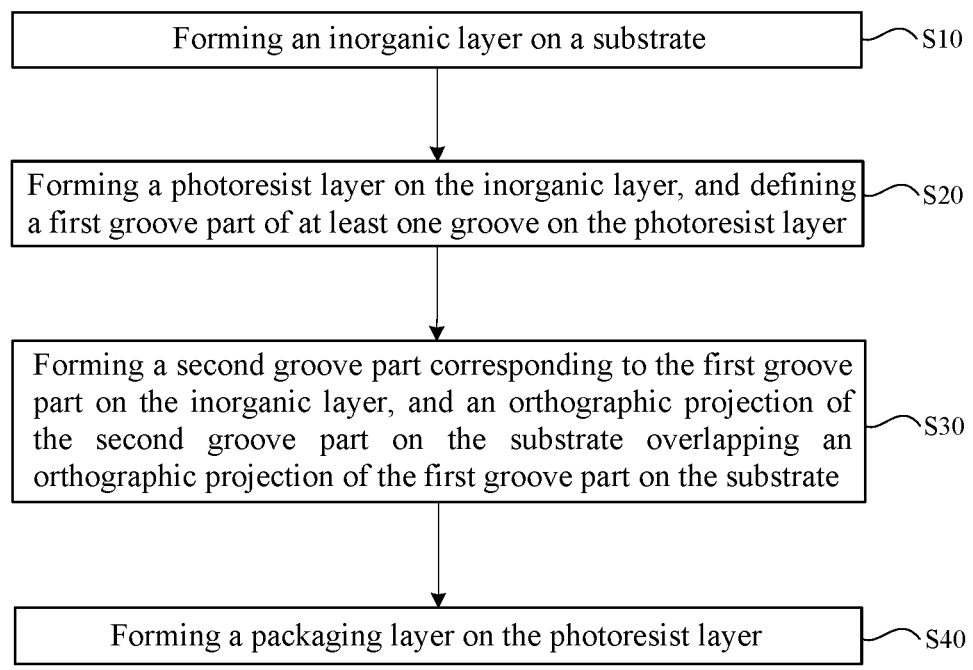
FIG. 7 is a flowchart of a manufacturing method of the display panel provided by the embodiment of the present application.

On another hand, referring to FIG. 7, FIG. 7 is a flowchart of a manufacturing method of a display panel provided by an embodiment of the present application. As shown in FIG. 7, the present application provides the manufacturing method of the display panel, including following steps:

S10: forming an inorganic layer 20 on a substrate 10.

In the embodiment of the present application, an inorganic film layer is formed by a physical vapor deposition process, and the inorganic film layer is patterned by a yellow light process or a dry etching process to form the inorganic layer 20.

S20: forming a photoresist layer 30 on the inorganic layer 20, and forming a first groove part 51 of a groove 50 on the photoresist layer 30.

In the embodiment of the present application, a photoresist film layer is formed by coating, the photoresist film layer is patterned by a yellow light process, and the first groove part 51 is formed in a cutting area 103 to form the photoresist layer 30.

S30: forming a second groove part 52 corresponding to the first groove part 51 on the inorganic layer 20, and an orthographic projection of the second groove part 52 on the substrate 10 overlapping an orthographic projection of the first groove part 51 on the substrate 10.

In the embodiment of the present application, the inorganic layer 20 is dry etched at a position corresponding to the first groove part 51 in the cutting area 103 to form the second groove part 52, and a time of dry etching is prolonged to over etch the second groove part 52, so that an edge of the inorganic layer 20 at the second groove part 52 indents within an edge of the photoresist layer 30, that is, a groove diameter of the second groove part 52 away from the substrate 10 is greater than a groove diameter of the first groove part 51 close to the second groove part 52.

S40: forming a packaging layer 40 on the photoresist layer 30.

In the embodiment of the present application, the packaging layer 40 can adopt an inorganic packaging layer, an organic packaging layer, or the inorganic packaging layer and the organic packaging layer alternately stacked. Specifically, the packaging layer 40 is disconnected at the groove 50. That is, the packaging layer 40 in the groove 50 is disconnected with the packaging layer 40 outside the groove 50. When cutting the display panel along a cutting line C, cutting cracks are generated from a cutting position of the packaging layer 40 in the groove 50, and the cutting cracks will stop when extending to a wall of the groove 50, that is, the cutting cracks will not exist in the packaging layer 40 outside the groove 50, which avoids a failure problem of the packaging layer 40 caused by the cutting cracks of the packaging layer 40 extending to a display area AA of the display panel, and meanwhile, a narrow frame design can be achieved to further ensure quality of the display panel.

As a specific embodiment of the present application, the step of forming the second groove part 52 corresponding to the first groove part 51 on the inorganic layer 20, and the orthographic projection of the second groove part 52 on the substrate 10 overlaps the orthographic projection of the first groove part 51 on the substrate 10, specifically includes: forming a metal layer 60 on a side of the inorganic layer 20 close to the substrate 10, and forming a third groove part 53 corresponding to the second groove part 52 on the metal layer 60; an orthographic projection of the third groove part 53 on the substrate 10 overlaps the orthographic projection of the second groove part 52 on the substrate 10. A manufacturing method of a display panel in the specific embodiment is same as above manufacturing method, and will not be repeated here.

The present application provides the display panel and the manufacturing method thereof. By forming the first groove part 51 and the second groove part 52 into the "eaves-like" inscribed structure, when cutting the display panel, it is difficult for the cutting cracks to extend out of the area where the groove 50 located, which avoids the failure problem of the packaging layer 40 caused by the cutting cracks of the packaging layer 40 extending to the display area AA of the display panel, and achieves the narrow frame design.

The above describes the display panel and the manufacturing method thereof provided in the embodiments of the present application in detail. In this paper, specific examples are applied to explain a principle and implementation modes of the present application. The descriptions of the above embodiments are only used to help understand a method and a core idea of the present application; meanwhile, for those skilled in the art, there will be changes in the specific implementation modes and an application scope according to the idea of the present application. In conclusion, contents of the specification should not be understood as restrictions on the present application.

What is claimed is:

1. A display panel comprising:
 a substrate;
 an inorganic layer, the inorganic layer disposed on the substrate;
 a photoresist layer, the photoresist layer disposed on a side of the inorganic layer away from the substrate;
 a packaging layer, the packaging layer disposed on a side of the photoresist layer away from the substrate; and
 at least one groove, the at least one groove comprising a first groove part penetrating the photoresist layer and a second groove part penetrating the inorganic layer, wherein an orthographic projection of the second groove part on the substrate covers an orthographic projection of the first groove part on the substrate, and wherein a groove diameter of the second groove part away from the substrate is greater than a groove diameter of the first groove part close to the second groove part;
 wherein a side of the first groove part close to the substrate is provided with a first opening, a side of the second groove part away from the substrate is provided with a second opening, the first opening is located above the second opening and communicated with the second opening, a diameter of the first opening is smaller than a diameter of the second opening, and the packaging layer is in contact with an inner wall of the first groove part and is disconnected at the first opening.

2. The display panel according to claim 1, wherein the groove diameter of the second groove part away from the substrate is at least 200 nm greater than the groove diameter of the first groove part close to the second groove part.

3. The display panel according to claim 2, wherein a thickness of the inorganic layer is greater than 100 nm.

4. The display panel according to claim 2, wherein the display panel further comprises a metal layer, the metal layer is disposed on a side of the inorganic layer close to the substrate, the metal layer is provided with a third groove part corresponding to the second groove part, and an orthographic projection of the third groove part on the substrate covers the orthographic projection of the second groove part on the substrate.

5. The display panel according to claim 4, wherein a cross-section shape of the first groove part along a first direction, a cross-section shape of the second groove part along the first direction, and a cross-section shape of the third groove part along the first direction are all inverted trapezoids.

6. The display panel according to claim 1, wherein the display panel comprises at least two grooves.

7. The display panel according to claim 6, wherein one of the at least two grooves is located on a cutting line.

8. The display panel according to claim 1, wherein the display panel comprises a display area and a border area; the border area comprises a wiring area, an effective packaging area, and a cutting area; the effective packaging area is located between the wiring area and the cutting area, the wiring area is located at a side of the effective packaging area close to the display area, the cutting area is located at another side of the effective packaging area away from the display area, and both the first groove part and the second groove part are located in the cutting area of the border area.

9. The display panel according to claim 1, wherein the packaging layer covers the inner wall of the first groove part; and
 wherein the first groove part and the second groove part form an "eaves-like" inscribed structure.

10. The display panel according to claim 1, wherein the display panel further comprises a metal layer disposed between the substrate and the inorganic layer, the metal layer is provided with a third groove part corresponding to and communicated with the second groove part; and wherein a diameter of an opening of a side of the second groove close to the substrate is less than a diameter of an opening of a side of the third groove away from the substrate.

11. The display panel according to claim 1, wherein the packaging layer is configured to extend into the first groove part and disconnect at a bottom of the first groove part, and the packaging layer exposes the inner wall of the first groove part.

12. The display panel according to claim 1, wherein an inner wall of the second groove part is not covered by the packaging layer.

* * * * *